United States Patent
Karda et al.

(10) Patent No.: US 9,773,976 B2
(45) Date of Patent: *Sep. 26, 2017

(54) TRANSISTORS AND METHODS OF FORMING TRANSISTORS

(71) Applicant: Micron Technology, Inc., Boise, ID (US)

(72) Inventors: Kamal M. Karda, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/385,605

(22) Filed: Dec. 20, 2016

(65) Prior Publication Data

US 2017/0104155 A1   Apr. 13, 2017

Related U.S. Application Data

(63) Continuation of application No. 15/003,679, filed on Jan. 21, 2016, now Pat. No. 9,559,194, which is a
(Continued)

(51) Int. Cl.
*H01L 45/00* (2006.01)
*H01L 27/24* (2006.01)
(Continued)

(52) U.S. Cl.
CPC ........ *H01L 45/1206* (2013.01); *H01L 23/535* (2013.01); *H01L 27/228* (2013.01);
(Continued)

(58) Field of Classification Search
CPC ......... H01L 29/66977; H01L 21/02568; H01L 29/7827; H01L 21/02532; H01L 29/267;
(Continued)

(56) References Cited

U.S. PATENT DOCUMENTS 6,236,076 B1   5/2001   Arita et al.
6,370,056 B1   4/2002   Chen et al.
(Continued)

FOREIGN PATENT DOCUMENTS

JP   2009-170511   7/2009
TW   449924   8/2001
(Continued)

OTHER PUBLICATIONS

U.S. Appl. No. 13/964,309, filed Aug. 12, 2013, Karda et al.
(Continued)

*Primary Examiner* — Roy Potter
*Assistant Examiner* — Paul Patton
(74) *Attorney, Agent, or Firm* — Wells St. John P.S.

(57) ABSTRACT

Some embodiments include a transistor having a drain region and a source region. A conductive gate is between the source and drain regions. First channel material is between the gate and the source region. The first channel material is spaced from the gate by one or more insulative materials. Second channel material is between the first channel material and the source region, and directly contacts the source region. The first and second channel materials are transition metal chalcogenide. One of the source and drain regions is a hole reservoir region and the other is an electron reservoir region. Tunnel dielectric material may be between the first and second channel materials.

40 Claims, 8 Drawing Sheets

Related U.S. Application Data continuation of application No. 14/516,396, filed on Oct. 16, 2014, now Pat. No. 9,276,092.

(51) Int. Cl.
  H01L 27/22   (2006.01)
  H01L 23/535  (2006.01)
  H01L 43/02   (2006.01)
  H01L 43/10   (2006.01)

(52) U.S. Cl.
  CPC .......... H01L 27/2454 (2013.01); H01L 43/02 (2013.01); H01L 43/10 (2013.01); H01L 45/142 (2013.01); H01L 45/143 (2013.01)

(58) Field of Classification Search
  CPC .......... H01L 29/66666; H01L 27/2454; H01L 27/2463; H01L 27/249; H01L 45/144; H01L 45/146; H01L 45/147; H01L 21/823487; H01L 27/105; H01L 27/2481; H01L 29/66484; H01L 21/8239
  See application file for complete search history.

(56) References Cited

U.S. PATENT DOCUMENTS

| | | | |
|---|---|---|---|
| 6,674,109 B1 | 1/2004 | Fujimori et al. | |
| 6,717,215 B2 | 4/2004 | Fricke et al. | |
| 6,885,048 B2 | 4/2005 | Tarui et al. | |
| 7,180,141 B2 | 2/2007 | Eliason et al. | |
| 7,525,830 B2 | 4/2009 | Kang | |
| 7,902,594 B2 | 3/2011 | Ono | |
| 8,021,897 B2 | 9/2011 | Sills et al. | |
| 8,273,654 B1 | 9/2012 | Nelson et al. | |
| 8,304,823 B2 | 11/2012 | Boescke | |
| 8,796,085 B2 | 8/2014 | Koldiaev | |
| 9,559,194 B2 * | 1/2017 | Karda ................... | H01L 27/115 |
| 2002/0125536 A1 | 9/2002 | Iwasa et al. | |
| 2003/0183769 A1 | 10/2003 | Ito et al. | |
| 2004/0004240 A1 | 1/2004 | Nishikawa | |
| 2004/0036111 A1 | 2/2004 | Nishikawa et al. | |
| 2004/0090815 A1 | 5/2004 | Tajiri | |
| 2005/0282296 A1 | 12/2005 | Hsu et al. | |
| 2006/0014307 A1 | 1/2006 | Kweon | |
| 2006/0118841 A1 | 6/2006 | Eliason et al. | |
| 2007/0108524 A1 | 5/2007 | Ito et al. | |
| 2007/0272960 A1 | 11/2007 | Hsu et al. | |
| 2008/0225569 A1 | 9/2008 | Nawano | |
| 2009/0095950 A1 | 4/2009 | Lieber et al. | |
| 2009/0209051 A1 | 8/2009 | Kang | |
| 2010/0110753 A1 | 5/2010 | Slesazeck | |
| 2010/0110758 A1 | 5/2010 | Li | |
| 2010/0140589 A1 | 6/2010 | Ionescu | |
| 2010/0289559 A1 | 11/2010 | Forbes | |
| 2010/0321975 A1 | 12/2010 | Kimura et al. | |
| 2011/0012085 A1 | 1/2011 | Deligianni et al. | |
| 2011/0033955 A1 | 2/2011 | Kang | |
| 2011/0248324 A1 | 10/2011 | Kang | |
| 2012/0248398 A1 | 10/2012 | Liu | |
| 2012/0280291 A1 | 11/2012 | Lee et al. | |
| 2012/0319185 A1 | 12/2012 | Liang et al. | |
| 2013/0037823 A1 | 2/2013 | Kanemura et al. | |
| 2013/0043455 A1 | 2/2013 | Bateman | |
| 2013/0056698 A1 | 3/2013 | Satoh et al. | |
| 2013/0126816 A1 | 5/2013 | Tang et al. | |
| 2014/0117304 A1 | 5/2014 | Park | |
| 2014/0153312 A1 | 6/2014 | Sandhu et al. | |
| 2014/0183453 A1 | 7/2014 | Kim et al. | |
| 2014/0269002 A1 | 9/2014 | Jo | |
| 2014/0269046 A1 | 9/2014 | Laurin et al. | |

FOREIGN PATENT DOCUMENTS

| | | |
|---|---|---|
| TW | 483170 | 4/2002 |
| WO | WO 2008-073529 | 6/2008 |
| WO | PCT/US2014/047570 | 11/2014 |
| WO | PCT/US2015/025894 | 7/2015 |
| WO | PCT/US2015/032999 | 8/2015 |
| WO | PCT/US2015/040789 | 10/2015 |
| WO | PCt/US2016/013174 | 5/2016 |
| WO | PCT/US2015/040789 | 4/2017 |

OTHER PUBLICATIONS

U.S. Appl. No. 14/152,664, filed Jan. 10, 2014, Karda.
U.S. Appl. No. 14/260,977, filed Apr. 24, 2014, Ramaswamy.
U.S. Appl. No. 14/305,459, filed Jun. 16, 2014, Ramaswamy et al.
U.S. Appl. No. 14/508,912, filed Oct. 7, 2014, Ramaswamy.
Breakdown of High-Performance Monolayer MoS2 Transistors; Lembke et al.; www.acsnano.org; Oct. 2012; pp. A-F.
Current Status of Ferroelectric Random-Acess Memory; Arimoto et al.; MRS Bulletin; Nov. 2004; pp. 823-828.
Das et al.; High Performance Multlayer MoS2 Transistors with Scandium Contacts; NANO Letters; ACS Publications; Dec. 14, 2012; pp. 100-105.
Ferroelectric Nonvolatile Nanowire Memory Circuit Using a Single ZnO Nanowire and Copolymer Top Layer; Tack Lee et al.; Advanced Materials 2012, 24, pp. 3020-3025.
Ferroelectric RAM; http://en.wikipedia.org/wiki/Ferroelectric_RAM; Last Modified Feb. 25, 2013; 6 pp.
Large Area Vapor Phase Growth and Characterization of MoS2 Atomic Layers on SiO2 Substrate; Zhan et al.; Dept. of Mechanical Engineering & Materials Science; Rice University: Feb. 15, 2012; 24 pp.
Liu et al.; Growth of Large-Area and Highly Crystailine MoS2 Thin Layers on Insulating Substrates; NANO Letters; ACS Publications; Feb. 27, 2012; pp. 1538-1544.
Min et al.; Nanosheet thickness-modulated MoS2 dielectric property evidenced by field-effect transistor performance; The Royal Society of Chemistry; Dec. 3, 2012; 2 pp.
MoS 2 Nanosheets for Top-Gate Nonvolatile Memory Transistor Channel; Sung Lee et al.; Small 2012,8, No. 20, pp. 3111-3115.
Nonvolatile ferroelectric-gate field-effect transistors using SrBi2Ta2O9/Pt/SRTa2O6/SiON/Si structures; E. Tokumitsu; Applied Physics Letters, vol. 75, No. 4; Jul. 26, 1999; pp. 575-577.
Pandey et al., "Structural, ferroelectric and optical properties of PZT thin films", 2005, PHYSICA B, vol. 368, Nov. 2005; pp. 135-142.
R.S. Lous; Ferroelectric Memory Devices, How to store information of the future; Top Master Programme in Nanoscience; Jul. 2011; 23 pp.
Recent Progress of Ferroelectric-Gate Field-Effect Transistors and Applications to Nonvolatile Logic and FeNAND Flash Memory; Sakai et al.; Materials 2010, 3, Nov. 18, 2010; pp. 4950-4964.
Robertson, "Band offsets of wide-band-gap oxides and implications for future electronic devices"; J. Vac. Sci. Technol., B 18(3); May 2000; pp. 1785-1791.
Single-layer MoS2 transistors; Radisavljevic et al.; Nature Nanotechnology; vol. 6; Mar. 2011; pp. 147-150.
W. Liu et al.; Role of Metal Contacts in Designing High-Performance Monolayer n-Type WSe2 Field Effect Transistors; NANO Letters; ACS Publications; Mar. 25, 2013; pp. 1983-1990.
Zhang et al.; Ambipolar MoS2 thin Flake Transistors; Nano Letters; ACS Publications; Jan. 25, 2012; pp. 1136-1140.
Kim et al., "A Fundamental Hybrid Memristor Crossbar Array/CMOS System for Data Storage and Neuromorphic Applications", Nano Letters, Dec. 5, 2011, pp. 389-395.
Lee et al., "Internal resistor of multi-functional tunnel barrier for selectivtiy and switching uniformity in resistive random access memory"; Nanoscale Research Letters, 2014, 7 pp.

* cited by examiner

__US 9,773,976 B2__

TRANSISTORS AND METHODS OF FORMING TRANSISTORS

RELATED PATENT DATA

This patent resulted from a continuation of U.S. patent application Ser. No. 15/003,679, which was filed Jan. 21, 2016, which issued as U.S. Pat. No. 9,559,194, and which is hereby incorporated herein by reference; which resulted from a continuation of U.S. patent application Ser. No. 14/516,396, which was filed Oct. 16, 2014, which issued as U.S. Pat. No. 9,276,092, and which is hereby incorporated herein by reference.

TECHNICAL FIELD

Transistors and methods of forming transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Transistors may be used in many types of memory. Transistors may also be incorporated into integrated circuitry other than memory.

DETAILED DESCRIPTION OF THE ILLUSTRATED EMBODIMENTS

One type of transistor is a so-called tunnel field effect transistor (tunnel FET). Such transistor may utilize band-to-band tunneling wherein an electron in a valence band of semiconductor material tunnels across a bandgap to a conduction band. Tunnel FETs advantageously have zero, or at least very low, current in an "off" state. However, a difficulty encountered in conventional tunnel FET configurations is that there may be poor current flow in the "on" state, and accordingly the devices may be slow. In some embodiments, new tunneling FETs are described which maintain the advantageous characteristics of the "off" state, and yet which have improved current flow in the "on" state. Specific example embodiments are described with reference to FIGS. 1-15.

Figure 1:
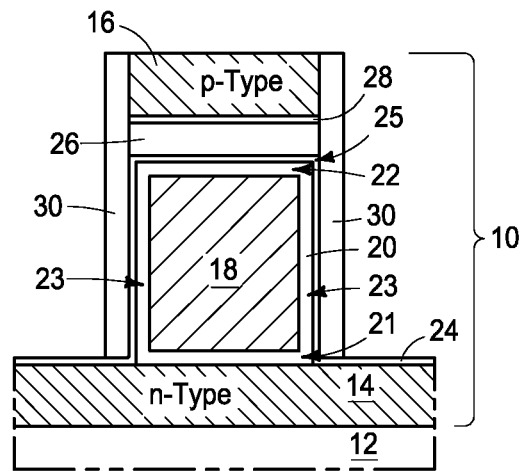
FIG. 1 is a diagrammatic cross-sectional view of an example embodiment transistor.

Referring to FIG. 1, an example embodiment transistor 10 is illustrated to be supported by a base 12.

The base 12 may comprise any suitable support material. For instance, in some embodiments the base 12 may comprise an insulative layer over a semiconductor material; and the semiconductor material may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to something other than a semiconductor substrate. In some embodiments, base 12 may comprise a conductive material (for instance, digit line material) electrically coupled to the transistor 10.

The transistor 10 includes a drain region 14 with n-type behavior (i.e., an electron reservoir) and a source region 16 with p-type behavior (i.e., a hole reservoir). The source and drain regions may comprise any suitable compositions. For instance, in some embodiments, the source and drain regions may comprise conductively-doped silicon. In other embodiments, one or both of the source and drain regions may comprise metal having characteristics suitable for utilization as either an electron reservoir or a hole reservoir. In some embodiments, drain region 14 may be referred to as an electron reservoir region, and source region 16 may be referred to as a hole reservoir region.

The transistor comprises a conductive gate material 18 surrounded by insulative material 20.

The gate material 18 may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). In some example embodiments, the gate material may comprise metal (for instance, titanium, tungsten, etc.) and/or metal nitride (for instance, titanium nitride, tungsten nitride, etc.).

The insulative material 20 may be referred to as gate dielectric in some embodiments, and may comprise any suitable composition or combination of compositions. For instance, the insulative material 20 may comprise, consist essentially of, or consist of silicon dioxide.

The insulative material 20 may be considered to comprise several regions; and specifically may be considered to comprise a bottom region 21 under gate 18, a top region 22 over the gate, and sidewall regions 23 along sidewalls of the gate. In the shown embodiment, all of the regions 21-23 are a same composition as one another. In other embodiments, one or more of the regions 21-23 may comprise a different composition than another of the regions 21-23. In some embodiments, region 21 may be referred to as a bottom insulative material, region 22 as a top insulative material, and regions 23 as sidewall insulative materials.

The bottom insulative material 21 directly contacts both the drain region 14 and the conductive gate 18 in the shown embodiment.

A channel material 24 extends over the top insulative region 22, along the sidewall insulative regions 23, and directly contacts a top of the drain region 14. The channel material 24 may comprise any suitable composition or combination of compositions; and in some embodiments may comprise, consist essentially of, or consist of transition metal chalcogenide. The transition metal chalcogenide may, for example, comprise, consist essentially of, or consist of transition metal dichalcogenide (for instance, $MoS_2$, $WS_2$, $InS_2$, $InSe_2$, $MoSe_2$, $WSe_2$, etc.) and/or transition metal trichalcogenide (for instance, $MoS_3$, $WS_3$, $InS_3$, $InSe_3$, $MoSe_3$, $WSe_3$, etc.) in some embodiments.

A region of channel material 24 over gate 18 may be referred to as a top region 25 of the channel material 24 in some embodiments.

Tunnel dielectric material 26 is over the top region 25 of channel material 24. The tunnel dielectric material may comprise any suitable composition or combination of compositions. For instance, the tunnel dielectric material 26 may comprise, consist essentially of, or consist of one or more oxides (e.g., aluminum oxide, hafnium oxide, zirconium oxide, silicon oxide, etc.).

A channel material 28 is over the tunnel dielectric material 26. In some embodiments, channel materials 24 and 28 may be referred to as first and second channel materials, respectively. The channel material 28 may comprise any of the compositions described above relative to the channel material 24. In some embodiments, the first and second channel materials are different compositions relative to one another. For instance, the first channel material 24 may comprise a sulfide (for instance, molybdenum sulfide) and the second channel material may comprise a selenide (for instance, tungsten selenide). The hole reservoir material 16 is directly against the second channel material 28. In some embodiments, material 28 may itself function as a hole reservoir.

The first and second channel materials 24 and 28 may be very thin, and in some embodiments may have thicknesses less than 10 nm, or even less than 5 nm. For instance, in some example embodiments the first and second channel materials may have thicknesses within a range of from about one monolayer to about seven monolayers. The first and second channel materials 24 and 28 may be about the same thickness as one another, or may be different thickness relative to one another.

Insulative material 30 is along sidewalls of transistor 10. The insulative material may comprise any suitable composition or combination of compositions; and in some embodiments may comprise, consist essentially of, or consist of one or both of silicon nitride and silicon dioxide.

Figure 2:
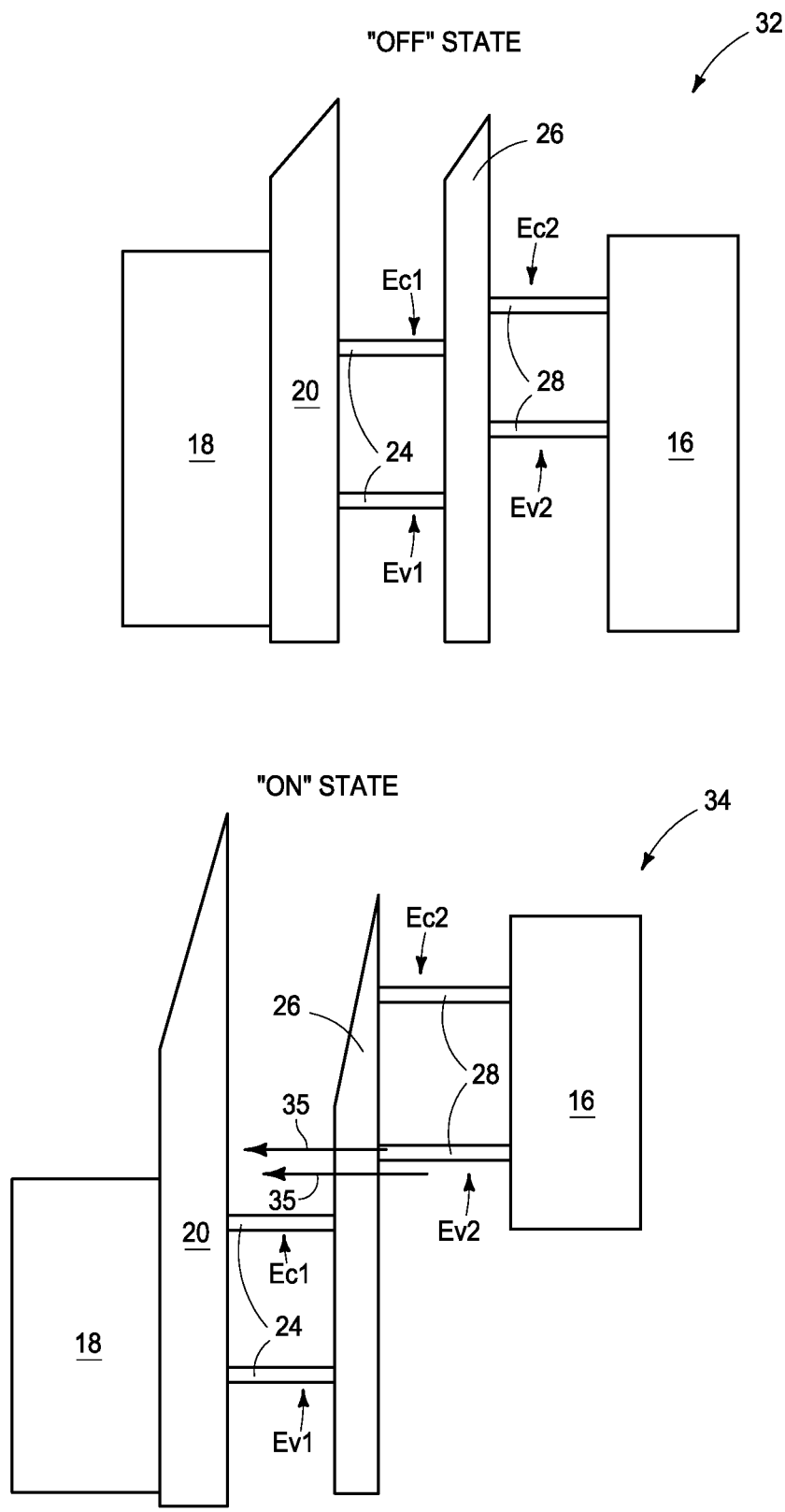
FIG. 2 is a bandgap diagram depicting operational states of the transistor of FIG. 1.

FIG. 2 shows band gap diagrams 32 and 34 of transistor 10 in an "off" state and an "on" state, respectively. The conduction band and valence band edges of first channel material 24 are labeled as Ec1 and Ev1, respectively; and the conduction band and valence band of second channel material 28 are labeled as Ec2 and Ev2, respectively. The Ec1, Ev1, Ec2 and Ev2 represent band edges; there is a continuous band above Ec and below Ev, and no states between Ec and Ev. Notably, there are no states to tunnel into in the "off" state, but interlayer tunneling becomes available in the "on" state (as indicated by arrows 35).

Figure 3:
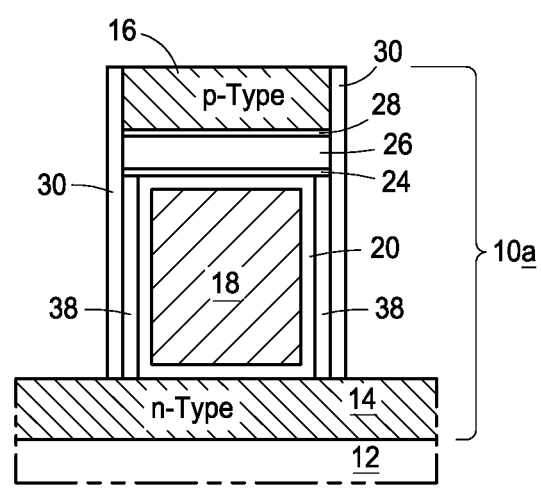
FIG. 3 is a diagrammatic cross-sectional view of another example embodiment transistor.

FIG. 3 illustrates another example embodiment transistor 10a. The transistor 10a is similar to the transistor 10 of FIG. 1, except that the first channel material 24 of transistor 10a does not extend into direct contact with drain region 14. Instead, interconnect material 38 extends between channel material 24 and the drain region 14. In some embodiments, the interconnect material may comprise semiconductor material (for instance, silicon and/or germanium) which is undoped (i.e., which has no more than $1\times10^{14}$ atoms/cm$^3$ of conductivity-enhancing impurity therein).

The interconnect material 38 directly contacts both the drain region 14 and the first channel material 24, and may function as a conductive pathway between the first channel material 24 and the drain region 14 in the "on" state of the transistor.

In some embodiments, the illustrated transistor 10a of FIG. 3 may be considered to be generic to either a transistor comprising an interconnect 38 of semiconductor material, or a transistor comprising an interconnect 38 of channel material 24 (e.g., the transistor 10 of FIG. 1).

The example embodiment transistors of FIGS. 1 and 3 may be formed with any suitable processing. Example processing is described with reference to FIGS. 4-14.

Figure 4:
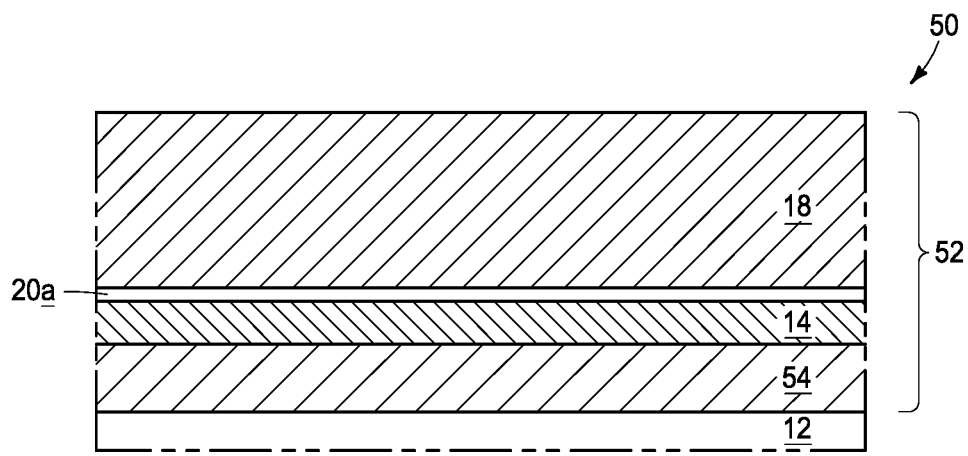
FIGS. 4-14 are diagrammatic cross-sectional views of example embodiment process stages which may be utilized in fabricating integrated circuitry comprising example embodiment transistors.

Referring to FIG. 4, a construction 50 is shown to comprise base 12 and a stack 52 over the base. The stack includes a digit line material 54, an electron reservoir drain region material 14, insulative material 20a, and conductive gate material 18. The insulative material 20a may be referred to as a first insulative material. Although the digit line material 54 is shown to be separate from base 12, in other embodiments the digit line material may be comprised by the base (for instance, if base 12 comprises silicon and the digit line material is a doped region of the silicon).

Figure 5:
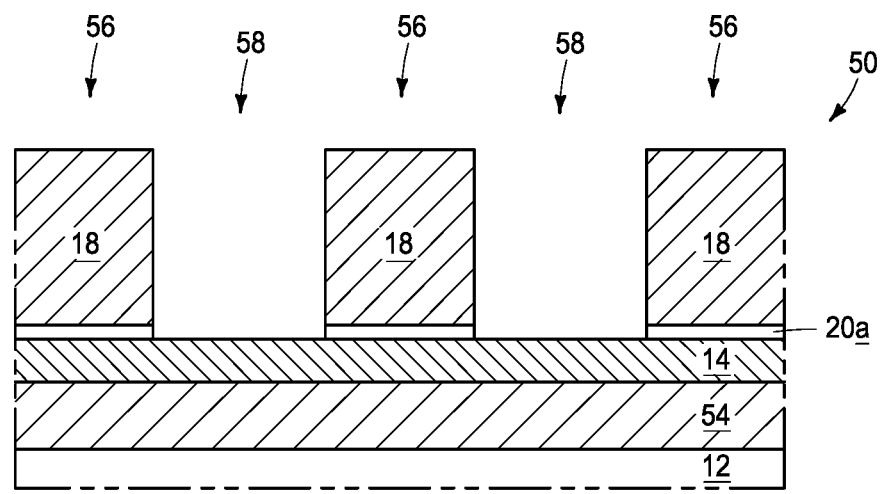

Referring to FIG. 5, the first insulative material 20a and gate material 18 are patterned into pillars 56 which are spaced one another by gaps 58. Such patterning may comprise any suitable processing. For instance, a mask (not shown) may be formed over stack 52 to define locations of the pillars, and subsequently etching may be conducted to form gaps 58. The mask may then be removed to leave the illustrated construction of FIG. 5.

Figure 6:
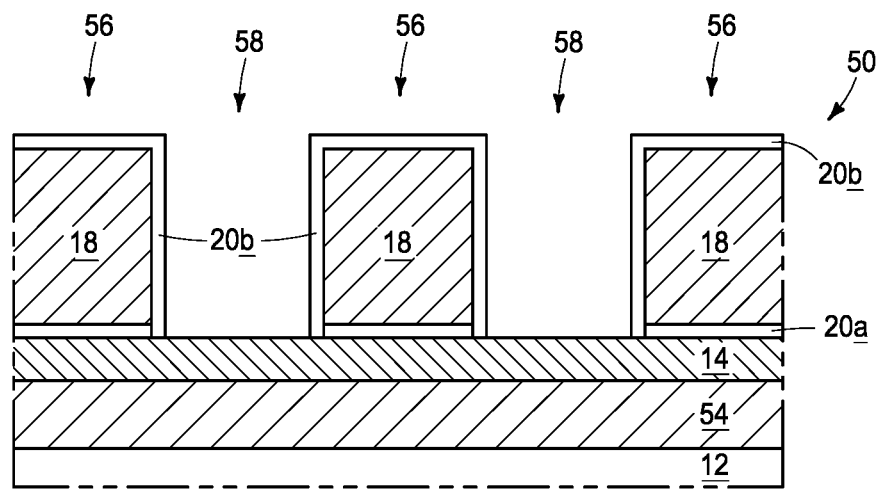

Referring to FIG. 6, second insulative material 20b is formed along tops and sidewalls of the pillars 56. The second insulative material may be formed and patterned utilizing any suitable processing. For instance, the second insulative material may be deposited, and subsequently masking and etching may be utilized to remove the material 20b from within gaps 58 while leaving the material along the tops and sidewalls of pillars 18. The insulative material 20b may comprise a same composition as insulative material 20a (for instance, both may comprise, consist essentially of, or consist of silicon dioxide) or may comprise a different composition from insulative material 20a (for instance, material 20b may comprise a different oxide than material 20a).

Figure 7:
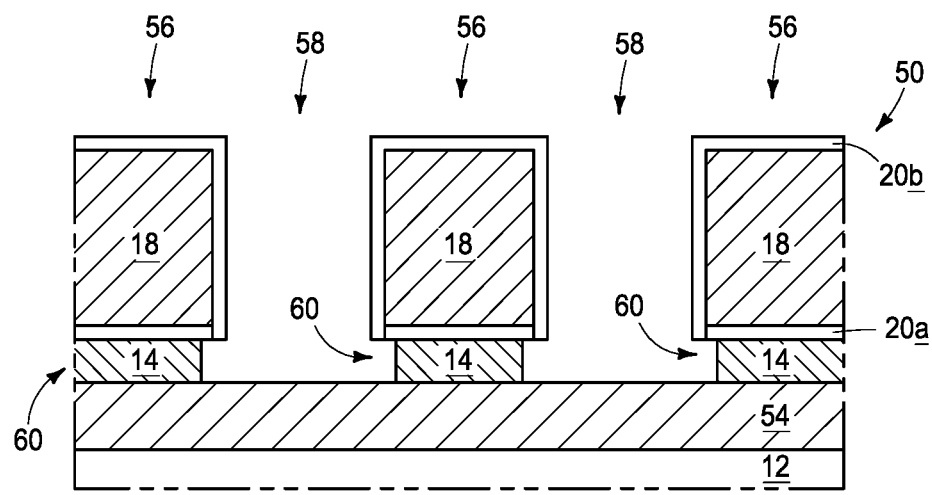

Referring to FIG. 7, the pillars 56 are utilized as a mask during an etch through drain region material 14. Such patterns the drain region material into pedestals 60 beneath the pillars.

Figure 8:
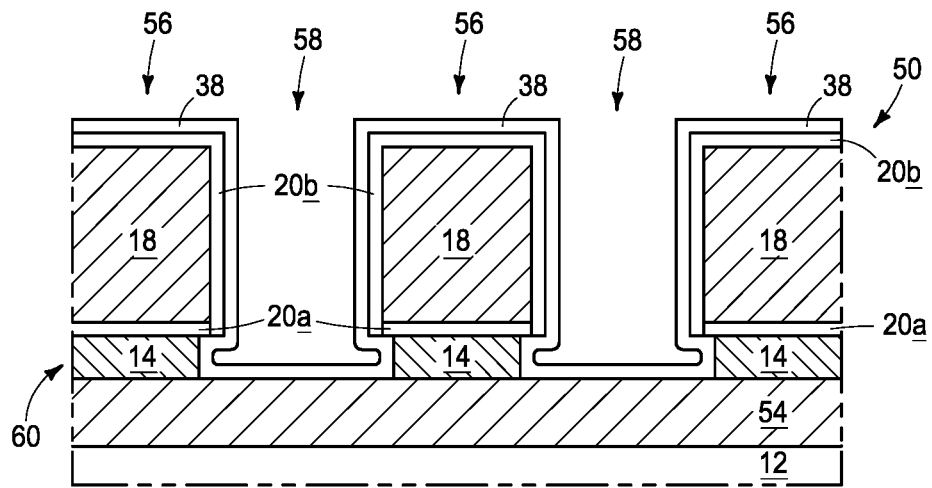

Referring to FIG. 8, interconnect material 38 is formed over and between the pillars. The interconnect material may comprise undoped semiconductor material in some embodiments, or may comprise channel material (e.g., may comprise a same material as the channel material 24 of FIG. 1) in other embodiments. The interconnect material may be patterned at any appropriate processing stage so that interconnects of transistors along a common wordline are separated from one another (with the wordlines extending in and out of the page relative to the cross-sectional view of FIG. 8).

Figure 9:
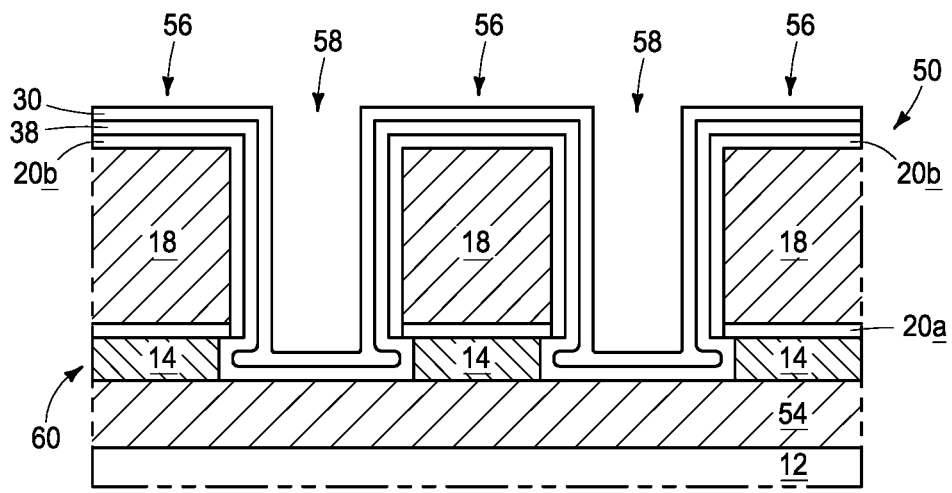

Referring to FIG. 9, insulative material 30 is formed over the interconnect material 38.

Figure 10:
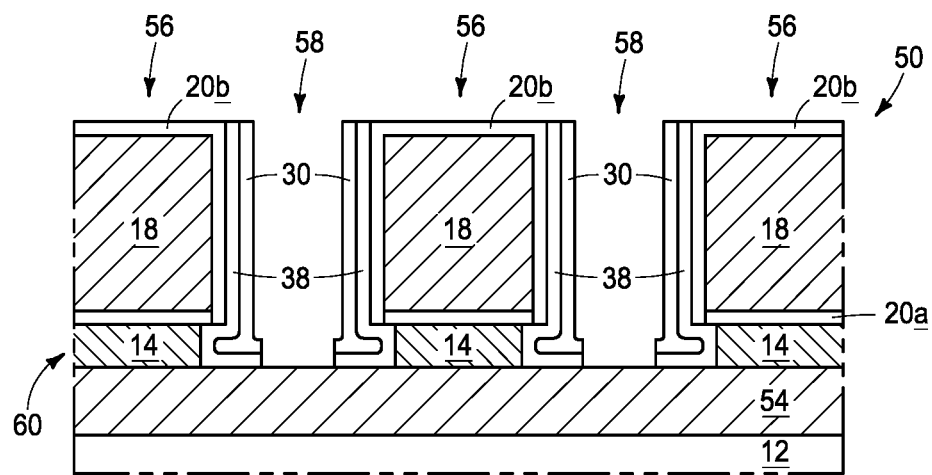

Referring to FIG. 10, materials 38 and 30 are removed from over a top surface of material 20b (for instance, utilizing chemical-mechanical polishing or other planarization), and the materials 38 and 30 are removed from regions within gaps 58 (for instance, utilizing an etch conducted while protecting pillars 56 and regions of material 38 and 30 along sidewalls of the pillars with a mask). The construction of FIG. 10 has the interconnecting material 38 formed along sidewalls of pillars 56 and pedestals 60, and has gaps 58 remaining over regions of digit line 54 between the pillars and pedestals.

Figure 11:
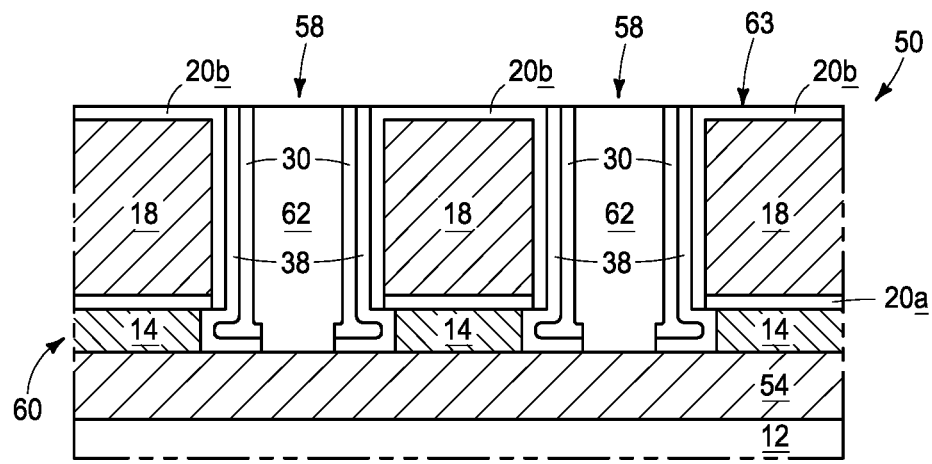

Referring to FIG. 11, insulative material 62 is formed within gaps 58 to fill the gaps; and a planarized surface 63 is formed across materials 20b, 38, 30 and 62. The insulative material 62 may comprise a same composition as material 30 in some embodiments, or may comprise a different composition than material 30. For instance, in some embodiments one of the materials 30 and 62 may comprise silicon nitride and the other may comprise silicon dioxide. In other embodiments, both of materials 30 and 62 may comprise silicon nitride, or both materials 30 and 62 may comprise silicon dioxide.

In some embodiments, material 62 may be referred to as a third insulative material to distinguish it from the materials 20a and 20b. In some embodiments, material 30 may be referred to as the third insulative material, and material 62 may be referred to as a fourth insulative material.

Figure 12:
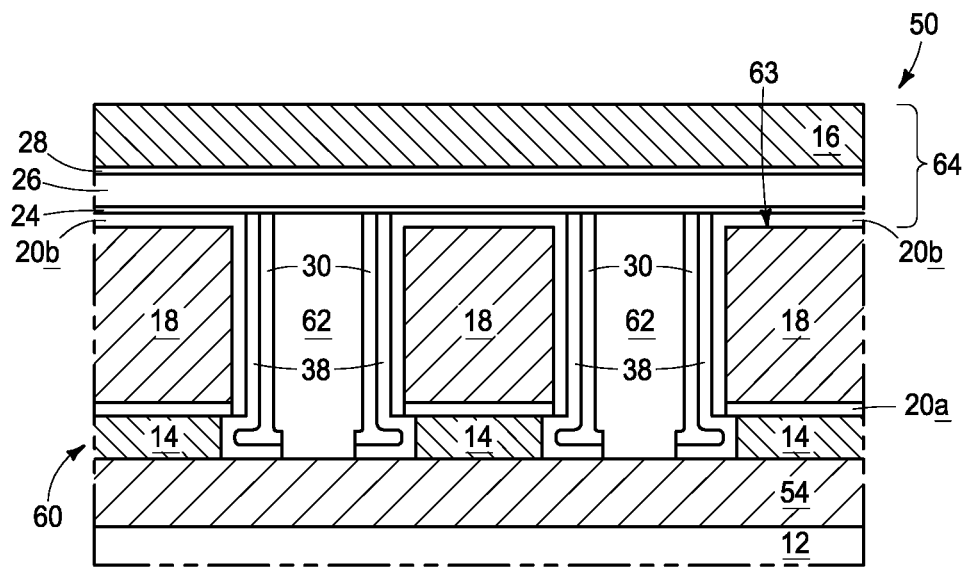

Referring to FIG. 12, a stack 64 is formed over planarized surface 63. The stack comprises first channel material 24, tunnel dielectric material 26, second channel material 28, and hole reservoir source region material 16.

Figure 13:
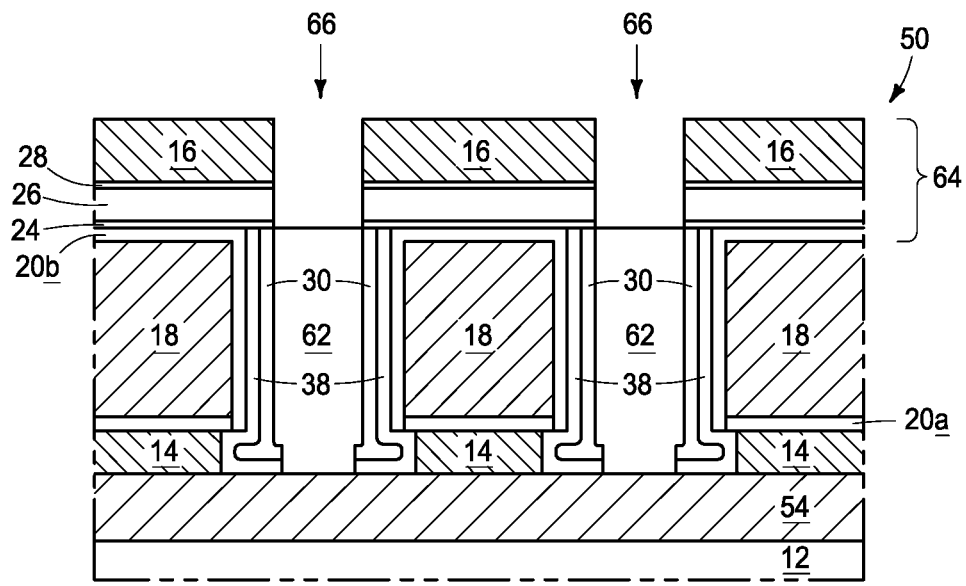

Referring to FIG. 13, openings 66 are formed through stack 64 to the insulative material 62. Such openings may be formed with any suitable processing. For instance, a patterned mask may be utilized to define locations of the openings, followed by one or more etches to form the openings. The mask may then be removed to leave the construction of FIG. 13.

Figure 14:
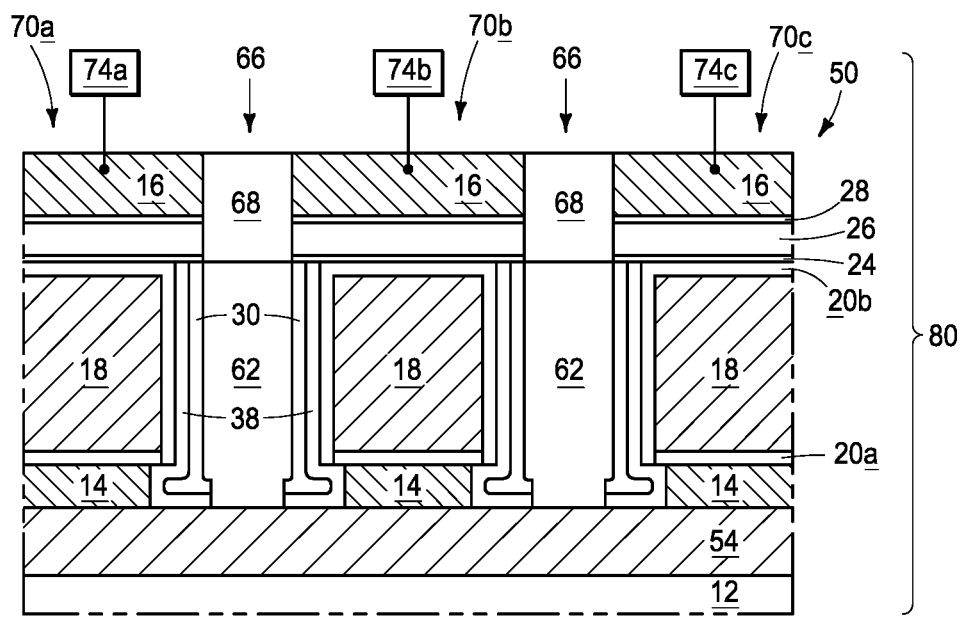

Referring to FIG. 14, the openings 66 are filled with insulative material 68. Material 68 may comprise any suitable composition or combination of compositions; and in some embodiments may comprise a same composition as one or both of materials 30 and 62, or may comprise a different composition relative to one or both of materials 30 and 62. In some embodiments, material 68 may comprise, consist essentially of, or consist of one or both of silicon dioxide and silicon nitride. In some embodiments, material 68 may be referred to as a fourth insulative material or as a fifth insulative material.

The construction of FIG. 14 comprises a plurality of transistors 70a-c. Such transistors may be representative of a large number of transistors formed in an array. The digit line 54 may be representative of a large number of digit lines that extend along columns of the array, and the gate material 18 may be incorporated into wordlines (extending in and out of the page relative to the cross-section of FIG. 14) that extend along rows of the array.

The source regions 16 of the transistors are shown connected to circuitry 74a-c. In some embodiments, the transistors are utilized in a memory array and the circuitry 74a-c corresponds to charge-storage devices (for instance capacitors) of DRAM devices, or to memory cells (for instance, phase change memory cells, conductive bridging RAM cells, other types of RRAM cells, magnetic RAM cells, etc.).

Figure 15:
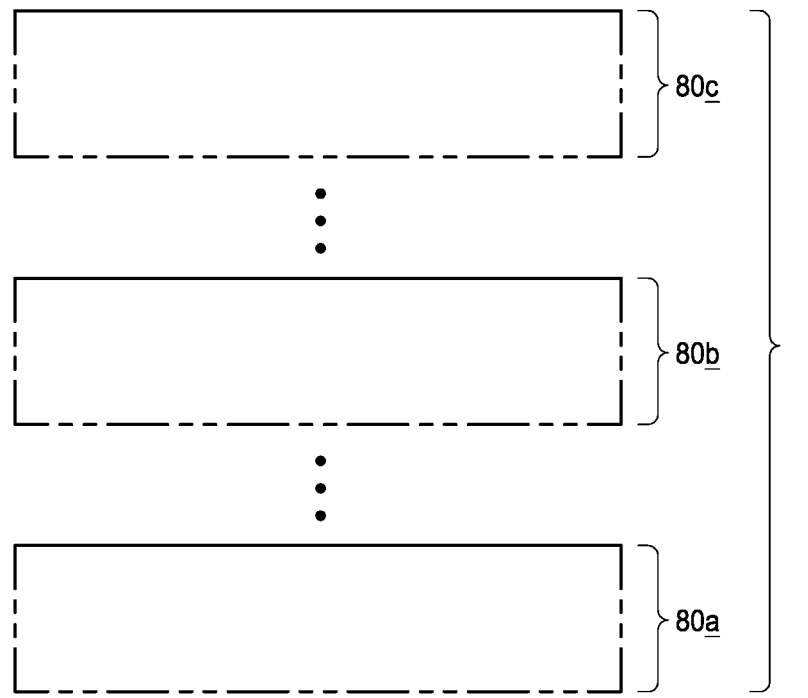
FIG. 15 is a diagrammatic cross-sectional view of an example embodiment stacking arrangement of multiple levels of integrated circuitry.

An advantage of the construction of FIG. 14 is that such may be readily stacked to form three-dimensional architecture. For instance, the construction of FIG. 14 is shown corresponding to a level (or tier) 80 of integrated circuitry. FIG. 15 shows that multiple levels 80a-c may be stacked one atop another in an integrated circuit architecture. The levels are spaced apart from one another to diagrammatically illustrate that there may be other circuitry (including, other levels or tiers) between the levels 80a-c.

Although regions 14 and 16 are illustrated as an electron reservoir region and a hole reservoir region respectively in the examples above; in other example embodiments the respective roles of regions 14 and 16 may be reversed so that region 14 is the hole reservoir region and region 16 is the electron reservoir region. In such instances, the compositions of materials 24 and 28 may be reversed or otherwise altered relative to the specific examples described relative to FIGS. 1-14.

In some embodiments, the tunnel dielectric 26 may be kept very thin (for instance, may have a thickness of less than or equal to 10 monolayers), or may even be omitted.

The structures and devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a transistor comprising a drain region and a source region. A conductive gate is between the source and drain regions. First channel material is between the gate and the source region. The first channel material is spaced from the gate by one or more insulative materials. Second channel material is between the first channel material and the source region, and directly contacts the source region. The first and second channel materials are transition metal chalcogenide. One of the source and drain regions is a hole reservoir region and the other is an electron reservoir region.

Some embodiments include a transistor comprising an electron reservoir drain region, a conductive gate over the drain region, bottom insulative material between the gate and the drain region, top insulative material over the gate, and sidewall insulative material along sidewalls of the gate and extending from a top of the gate to a bottom of the gate. First channel material extends over the top insulative material, along the sidewall insulative material, and directly contacts the drain region. A region of the first channel material above the gate is a top region of the first channel material. Tunnel dielectric material is over the top region of the first channel material. Second channel material is over the tunnel dielectric material. A hole reservoir source region is directly against the second channel material. The first and second channel materials are transition metal chalcogenide.

Some embodiments include a method of forming transistors. A stack is formed which comprises, an ascending order, digit line material, drain region material, first insulative material, and gate material. The first insulative material and gate material are patterned into pillars, and second insulative material is formed along tops and sidewalls of the pillars. After the second insulative material is formed, the pillars are utilized as a mask during an etch through the drain region material. The etch forms the drain region material into pedestals beneath the pillars. Interconnecting material is formed along sidewalls of the pillars and pedestals, and gaps are left over regions of the digit line material between the pillars and pedestals. The gaps are filled with third insulative material. A top surface across the second insulative material, interconnecting material and third insulative material is planarized. A stack is formed over the planarized top surface. The stack comprises, in ascending order, first channel material, tunnel dielectric material, second channel material and source region material. Openings are formed through the stack to the third insulative material. The openings are filled with fourth insulative material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A transistor comprising:
   a source region and a drain region; one of the source and drain regions being a hole reservoir region and the other being an electron reservoir region;
   a gate between the source and drain regions;
   first channel material between the gate and the source region; the first channel material being spaced from the gate by gate dielectric material; the gate dielectric material comprising silicon dioxide;
   second channel material between the first channel material and the source region, the second channel material being spaced from the first channel material by tunnel dielectric material; and
   wherein the first and second channel materials are transition metal dichalcogenide and/or transition metal trichalcogenide, and are different compositions relative to one another.

2. The transistor of claim 1 wherein the source and drain regions are the hole reservoir region and the electron reservoir region, respectively.

3. The transistor of claim 1 wherein the source and drain regions are the electron reservoir region and the hole reservoir region, respectively.

4. The transistor of claim 1 wherein the tunnel dielectric material comprises one or more oxides.

5. The transistor of claim 1 wherein the first channel material directly contacts the drain region.

6. The transistor of claim 1 wherein the first channel material does not directly contact the drain region.

7. The transistor of claim 1 wherein one of the first and second channel materials comprises a sulfide and the other comprises a selenide.

8. The transistor of claim 1 wherein one of the first and second channel materials comprises molybdenum sulfide and the other comprises tungsten selenide.

9. A transistor comprising:
   a source region and a drain region; one of the source and drain regions being a hole reservoir region and the other being an electron reservoir region;
   a gate between the source and drain regions;
   first channel material between the gate and the source region; the first channel material being spaced from the gate by gate dielectric material;
   second channel material between the first channel material and the source region, the second channel material being spaced from the first channel material by tunnel dielectric material;
   wherein the first channel material does not directly contact the drain region; and
   wherein an interconnect material extends from the drain region to the first channel material, the interconnect material comprising semiconductor material.

10. The transistor of claim 9 wherein the first and second channel materials are different compositions relative to one another.

11. The transistor of claim 9 wherein the first and second channel materials are transition metal dichalcogenide and/or transition metal trichalcogenide, and are different compositions relative to one another.

12. The transistor of claim 9 wherein the interconnect material comprises one or both of silicon and germanium; and wherein the interconnect material has no more than $1\times10^{14}$ atoms/cm$^3$ of conductivity-enhancing impurity therein.

13. The transistor of claim 12 wherein the interconnect material comprises silicon.

14. The transistor of claim 12 wherein the interconnect material comprises germanium.

15. The transistor of claim 12 wherein the interconnect material comprises silicon and germanium.

16. A memory array, comprising:
a plurality of transistors; each of the transistors comprising:
a source region spaced from a drain region; the source being a hole reservoir region and the drain region being an electron reservoir region;
a gate between the source and drain regions;
first channel material between the gate and the source region; the first channel material being spaced from the gate by gate dielectric material;
second channel material between the first channel material and the source region, the second channel material being spaced from the first channel material by tunnel dielectric material; and
the first and second channel materials being transition metal dichalcogenide and/or transition metal trichalcogenide, and being different compositions relative to one another; and
memory cells coupled with the source regions of each of the transistors.

17. The memory array of claim 16 wherein the memory cells are phase change memory cells.

18. The memory array of claim 16 wherein the memory cells are RRAM cells.

19. The memory array of claim 16 wherein the memory cells are magnetic RAM cells.

20. The memory array of claim 16 wherein the memory cells are conductive bridging RAM cells.

21. The memory array of claim 16 wherein the second channel material of each of the transistors is directly against the source region of each of the transistors.

22. The memory array of claim 16 wherein the first channel material of each of the transistors directly contacts the drain region of each of the transistors.

23. The memory array of claim 16 wherein the first channel material of each of the transistors does not directly contact the drain region each of the transistors.

24. The memory array of claim 23 wherein of each of the transistors includes an interconnect material which extends from the drain region of each of the transistors to the first channel material of each of the transistors; wherein the interconnect material comprises semiconductor material.

25. The memory array of claim 24 wherein the interconnect material of each of the transistors comprises one or both of silicon and germanium; and wherein the interconnect material of each of the transistors has no more than $1\times10^{14}$ atoms/cm$^3$ of conductivity-enhancing impurity therein.

26. The memory array of claim 25 wherein the interconnect material of each of the transistors comprises silicon.

27. The memory array of claim 25 wherein the interconnect material of each of the transistors comprises germanium.

28. The memory array of claim 25 wherein the interconnect material of each of the transistors comprises silicon and germanium.

29. The memory array of claim 25 being a first memory array within a first tier of a three-dimensional architecture; and wherein the three-dimensional architecture includes a second tier over said first tier; the second tier having a second memory array.

30. A memory array, comprising:
a plurality of transistors; each of the transistors comprising:
a source region spaced from a drain region; the source being a hole reservoir region and the drain region being an electron reservoir region;
a gate between the source and drain regions;
first channel material between the gate and the source region; the first channel material being spaced from the gate by gate dielectric material;
second channel material between the first channel material and the source region, the second channel material being spaced from the first channel material by tunnel dielectric material; and
the first and second channel materials being transition metal dichalcogenide and/or transition metal trichalcogenide, and being different compositions relative to one another; and
charge-storage devices coupled with the source regions of each of the transistors.

31. The memory array of claim 30 wherein the charge-storage devices are capacitors.

32. The memory array of claim 30 wherein the second channel material of each of the transistors is directly against the source region of each of the transistors.

33. The memory array of claim 30 wherein the first channel material of each of the transistors directly contacts the drain region of each of the transistors.

34. The memory array of claim 30 wherein the first channel material of each of the transistors does not directly contact the drain region of each of the transistors.

35. The memory array of claim 34 wherein an interconnect material extends from the drain region of each of the transistors to the first channel material of each of the transistors; wherein the interconnect material of each of the transistors comprises semiconductor material.

36. The memory array of claim 35 wherein the interconnect material of each of the transistors comprises one or both of silicon and germanium; and wherein the interconnect material of each of the transistors has no more than $1\times10^{14}$ atoms/cm$^3$ of conductivity-enhancing impurity therein.

37. The memory array of claim 36 wherein the interconnect material of each of the transistors comprises silicon.

38. The memory array of claim 36 wherein the interconnect material of each of the transistors comprises germanium.

39. The memory array of claim 36 wherein the interconnect material of each of the transistors comprises silicon and germanium.

40. The memory array of claim 30 being a first memory array within a first tier of a three-dimensional architecture; and wherein the three-dimensional architecture includes a second tier over said first tier; the second tier having a second memory array.

* * * * *

UNITED STATES PATENT AND TRADEMARK OFFICE
CERTIFICATE OF CORRECTION

Page 1 of 1

PATENT NO. : 9,773,976 B2
APPLICATION NO. : 15/385605
DATED : September 26, 2017
INVENTOR(S) : Karda et al.

It is certified that error appears in the above-identified patent and that said Letters Patent is hereby corrected as shown below:

On the Title Page

Item (72) Inventor is corrected to read:
-- Kamal M. Karda, Boise, (ID);
Gurtej S. Sandhu, Boise, (ID);
Chandra Mouli, Boise, (ID) --.

Signed and Sealed this
Twenty-ninth Day of October, 2019

Andrei Iancu
*Director of the United States Patent and Trademark Office*